US009081700B2

(12) United States Patent
Flinsbaugh et al.

(10) Patent No.: US 9,081,700 B2
(45) Date of Patent: Jul. 14, 2015

(54) HIGH PERFORMANCE READ-MODIFY-WRITE SYSTEM PROVIDING LINE-RATE MERGING OF DATAFRAME SEGMENTS IN HARDWARE

(71) Applicants: Western Digital Technologies, Inc., Irvine, CA (US); Skyera, Inc., San Jose, CA (US)

(72) Inventors: Jack W. Flinsbaugh, San Jose, CA (US); Rodney N. Mullendore, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 174 days.

(21) Appl. No.: 13/895,928

(22) Filed: May 16, 2013

(65) Prior Publication Data
US 2014/0344653 A1 Nov. 20, 2014

(51) Int. Cl.
*G06F 11/10* (2006.01)
*H04L 12/939* (2013.01)
*G06F 9/30* (2006.01)
*H03M 13/03* (2006.01)
*H03M 13/09* (2006.01)
*H04L 1/00* (2006.01)
*G06F 11/08* (2006.01)
*G06F 11/16* (2006.01)

(52) U.S. Cl.
CPC .......... *G06F 11/1004* (2013.01); *G06F 9/3004* (2013.01); *H03M 13/03* (2013.01); *H04L 49/55* (2013.01); *G06F 11/08* (2013.01); *G06F 11/10* (2013.01); *G06F 11/16* (2013.01); *G06F 2211/1085* (2013.01); *H03M 13/09* (2013.01); *H04L 1/0061* (2013.01); *H04L 49/555* (2013.01)

(58) Field of Classification Search
CPC .......... G06F 9/3004; G06F 2211/1085; G06F 11/1004; G06F 11/10; G06F 11/16; G06F 11/00; G06F 11/08; H03M 13/03; H03M 13/09; H04L 1/0061; H04L 49/55; H04L 49/555
See application file for complete search history.

(56) References Cited

U.S. PATENT DOCUMENTS

| 4,884,271 | A | * | 11/1989 | Concha et al. | ................ 714/764 |
| 5,477,541 | A | | 12/1995 | White et al. | |
| 5,778,013 | A | | 7/1998 | Jedwab | |
| 6,856,556 | B1 | | 2/2005 | Hajeck | |
| 6,944,168 | B2 | * | 9/2005 | Paatela et al. | ................ 370/401 |
| 7,126,857 | B2 | | 10/2006 | Hajeck | |
| 7,171,604 | B2 | | 1/2007 | Sydir et al. | |
| 7,203,890 | B1 | | 4/2007 | Normoyle | |

(Continued)

OTHER PUBLICATIONS

International Search Report and Written Opinion dated Oct. 24, 2014 from related PCT Serial No. PCT/US2014/038510, 9 pages.

*Primary Examiner* — John P Trimmings

(57) ABSTRACT

A method of merging data frames includes: receiving a first data frame having a plurality of sectors; receiving a second data frame having a plurality of sectors; generating a merged output data frame by merging, using a plurality of data paths including a plurality of multiplexers, sectors of the second data frame with sectors of the first data frame; and performing an error check on at least one check-data frame having sectors corresponding to those in the first data frame or the second data frame, where at least some of the sectors in the check-data frame are transmitted on a subset of the plurality of data paths that transmits sectors of the merged output data frame, and where the error check verifies the merged output data frame.

35 Claims, 8 Drawing Sheets

(56) References Cited

U.S. PATENT DOCUMENTS

| | | |
|---|---|---|
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,108,753 B2 | 1/2012 | Anderson et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2006/0107003 A1* | 5/2006 | Barnum et al. ............ 711/155 |
| 2006/0224823 A1* | 10/2006 | Morley et al. ............ 711/113 |
| 2007/0136411 A1 | 6/2007 | Katashita et al. |
| 2009/0222708 A1 | 9/2009 | Yamaga |
| 2009/0319877 A1* | 12/2009 | Bains et al. ............ 714/807 |
| 2010/0174849 A1 | 7/2010 | Walston et al. |
| 2010/0241936 A1 | 9/2010 | Hirth |
| 2010/0250793 A1 | 9/2010 | Syu |
| 2011/0099323 A1 | 4/2011 | Syu |
| 2011/0239085 A1 | 9/2011 | Yeung et al. |
| 2011/0283049 A1 | 11/2011 | Kang et al. |
| 2012/0117443 A1 | 5/2012 | Lee et al. |
| 2012/0151172 A1 | 6/2012 | Coteus et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

* cited by examiner

HIGH PERFORMANCE READ-MODIFY-WRITE SYSTEM PROVIDING LINE-RATE MERGING OF DATAFRAME SEGMENTS IN HARDWARE

BACKGROUND

1. Technical Field

This disclosure relates to data storage systems for computer systems. More particularly, the disclosure relates to ensuring that no undetectable data errors are introduced during a data modification process.

2. Related Art

Data storage systems provide storage for data of a host system. As solid-state storage capacity increases, semiconductor device features shrink. The smaller devices are more susceptible to "soft" errors caused by, for example, alpha-particles. While these soft errors do not cause permanent device damage, they corrupt data stored in devices such as registers and memories. Error checking codes such as cyclic redundancy codes (CRC) are used to determine whether a data error has occurred over data for which the CRC was calculated.

BRIEF DESCRIPTION OF THE DRAWINGS

Aspects and features of the present inventive concept will be more apparent by describing example embodiments with reference to the accompanying drawings, in which.

DETAILED DESCRIPTION

While certain embodiments are described, these embodiments are presented by way of example only, and are not intended to limit the scope of protection. The methods and systems described herein may be embodied in a variety of other forms. Furthermore, various omissions, substitutions, and changes in the form of the example methods and systems described herein may be made without departing from the scope of protection.

Overview

Solid state drives (SSDs) are employed as data storage systems for computer systems. To modify data stored in a memory location of a data storage system, a read-modify-write operation may be employed to read a memory location and write a new value into it. As storage capacity of SSDs increases, features sizes of the semiconductor devices forming the SSDs decreases. As a result of the smaller device feature sizes, SSDs are increasingly susceptible to soft errors which may corrupt data during read-modify-write operations.

System Overview

Some embodiments of the present inventive concept are directed to a Read Modify Write system and method which ensure that no undetectable data errors are introduced during a data modification process.

In one example embodiment, the Read-Modify-Write system (RMW) receives L-Page frames (i.e., logical page data frames having a plurality of sectors) via two channels. The RMW system operates on the received frames based on their types as determined by a merge mask, applying hardware optimization to what were formerly software processes. The RMW system can merge data frame sectors on-the-fly across frames and performs the appropriate bit-modifications based on the merge mask. The RMW system may minimize the firmware cycles required to perform read-modify-write operations.

Figure 1A:
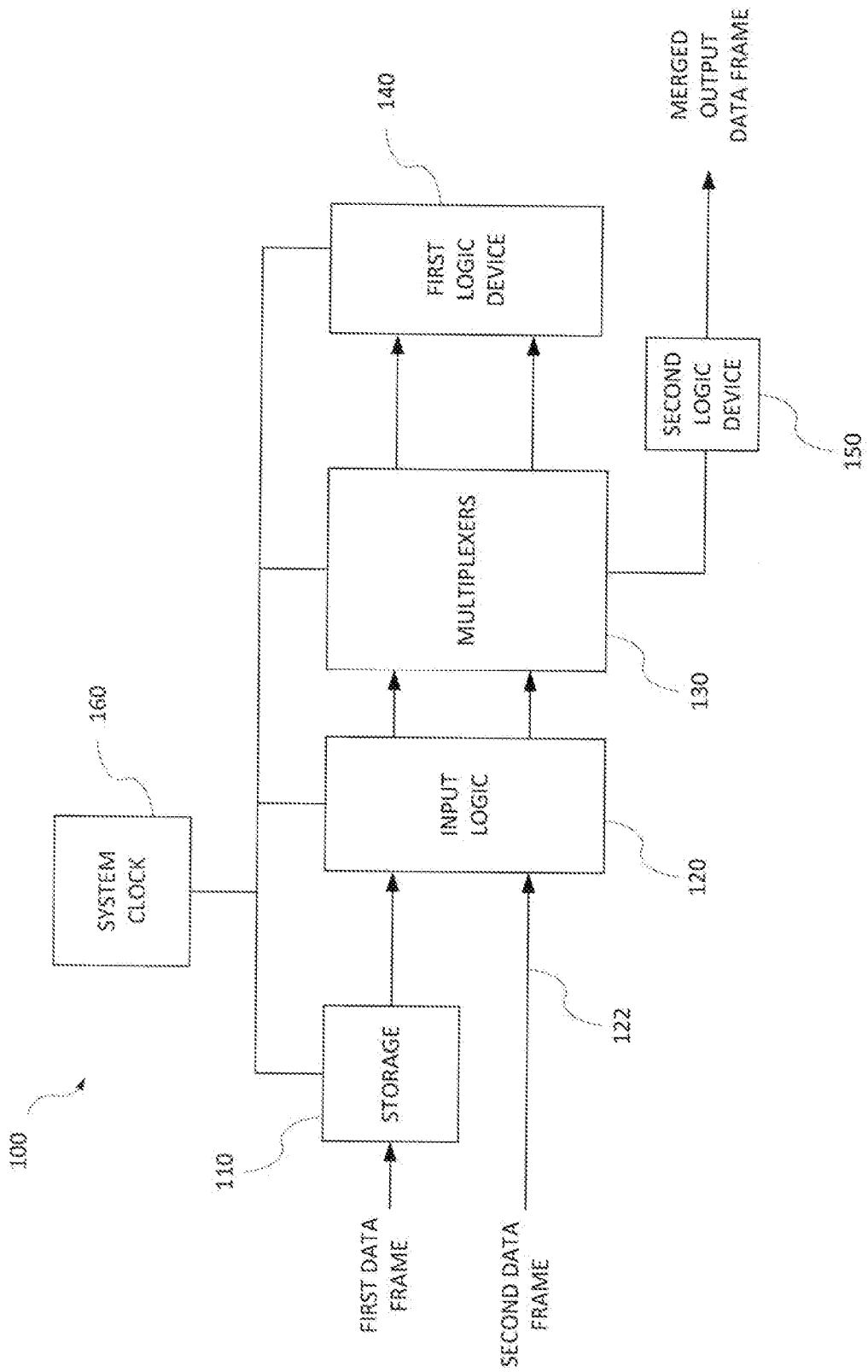
FIGS. 1A and 1B are block diagrams illustrating a read-modify-write system according to example embodiments of the present inventive concept.
Figure 1B:
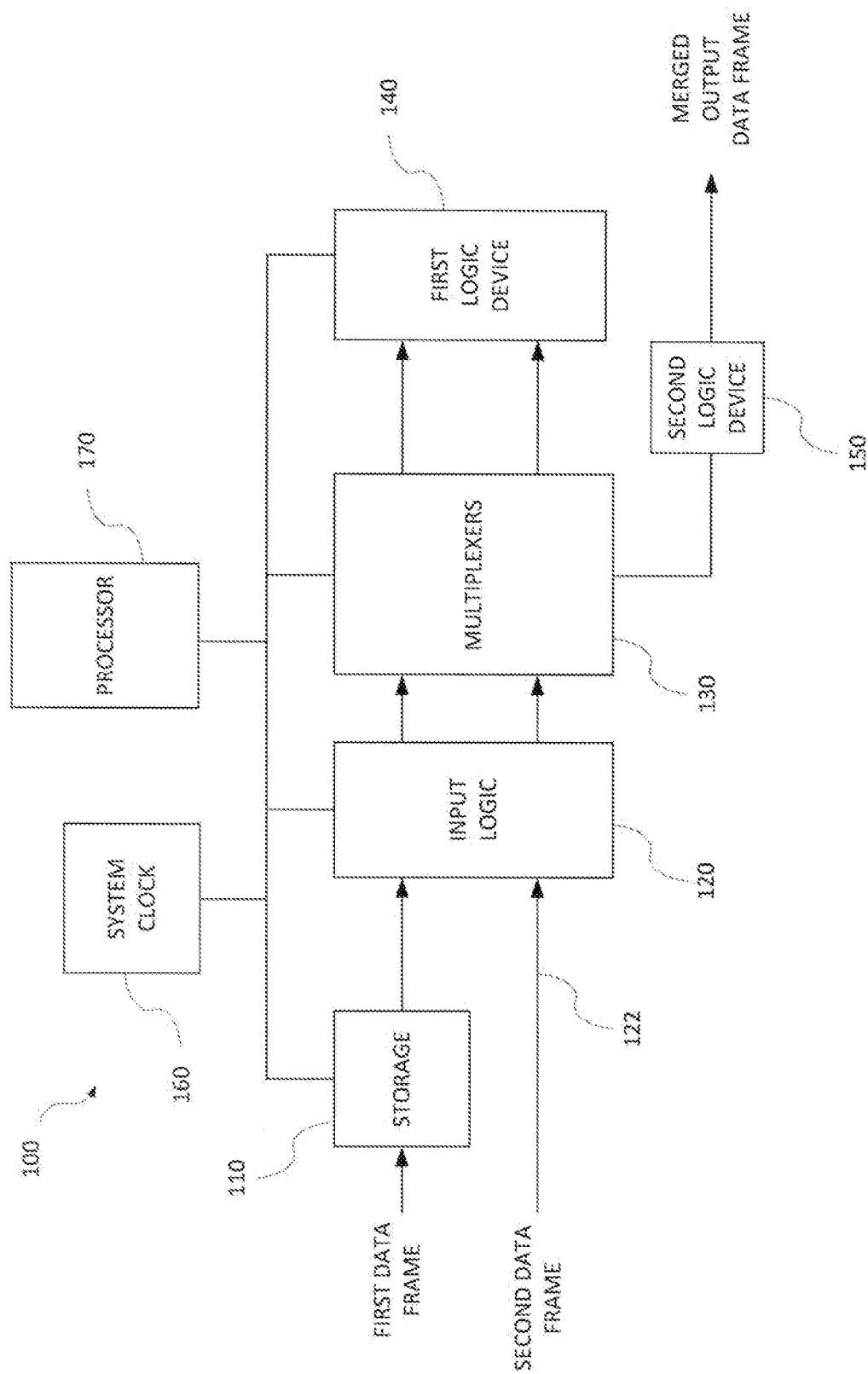

FIG. 1A is a block diagram illustrating a RMW system according to an example embodiment of the present inventive concept. As illustrated in FIG. 1A, the read-modify-write system 100 includes circuitry including a storage 110, input logic 120, a plurality of multiplexers 130, a first logic device 140, and a second logic device 150. The RMW system 100 is synchronized to a system clock 160 and may be scalable with system clock speed. In one embodiment, FIG. 1A offers a hardware-based approach that provides significant speed improvement in handling read-modify-write operations, which helps meet the high throughput requirements in many data storage devices today. As illustrated in FIG. 1B, the read-modify-write system according to an example embodiment may further include a processor 170 which controls at least some operations of the RMW system. In one example embodiment, the firmware executed on the processor 170 would control at least a portion of the logic checking described herein.

Read-Modify-Write

In operation, in one example embodiment the storage 110 receives a first data frame having a plurality of sectors and stores the first data frame in the storage 110 until a second data frame having a plurality of sectors is received at a data port 122. The second data frame is passed through the RMW system 100 sector by sector at about the system clock speed and is merged with the first data frame which is read from the storage 110. The first and second data frames are processed by the first logic device 140 to determine whether the merged output data frame is valid.

Figure 2:
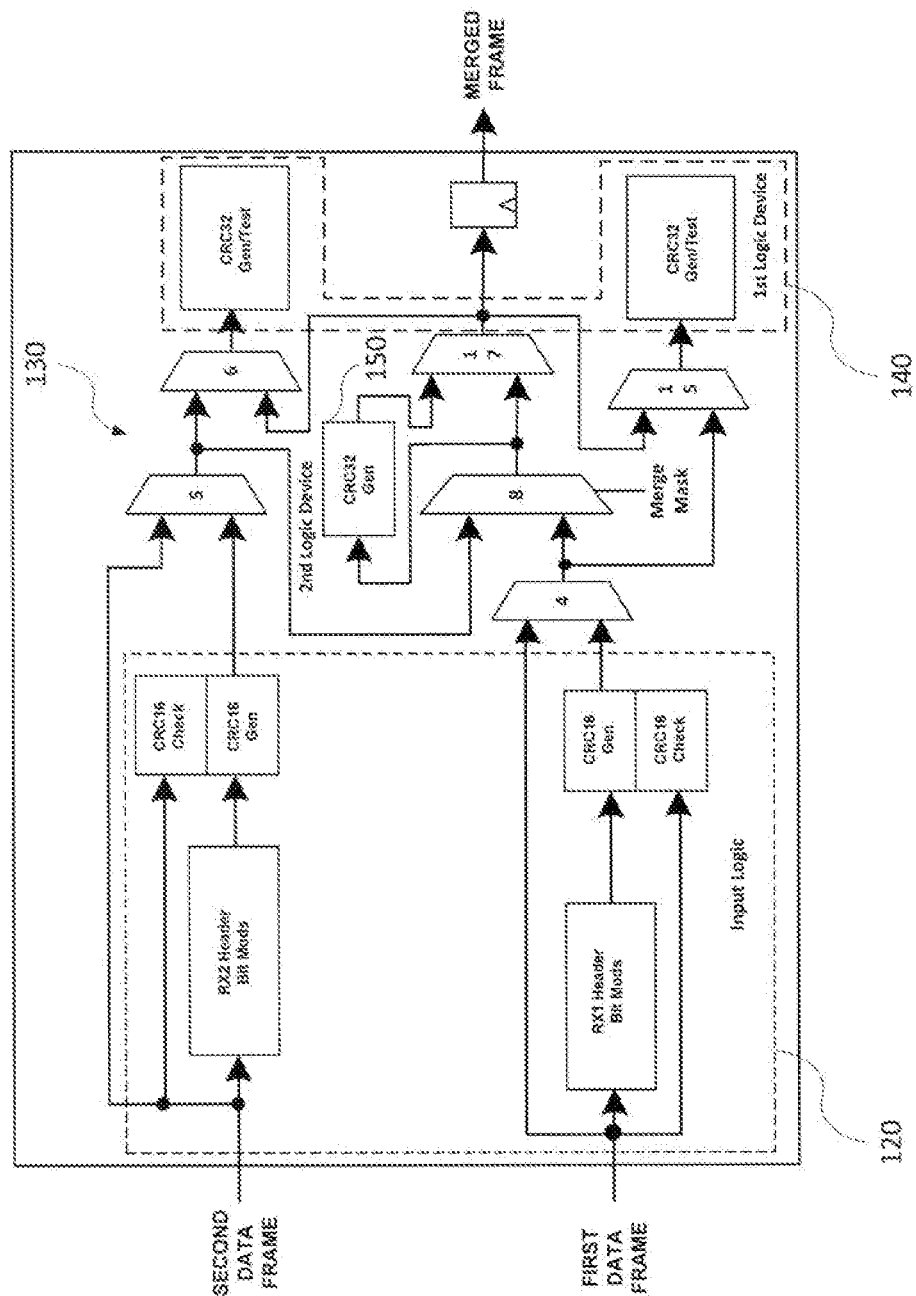
FIG. 2 is a schematic illustration showing details of the read-modify-write system according to an example embodiment of the present inventive concept.

FIG. 2 is a schematic illustration showing details of the read-modify-write system according to an example embodiment of the present inventive concept. Referring to FIG. 2, the input logic 120 receives the first and second data frames and verifies CRCs contained in the headers of each data frame. It must be noted that although CRCs are mentioned in the example embodiments in this disclosure, the use of other error detection mechanisms for example, but not limited to, checksums and hash functions, etc., are possible in some embodiments. The first and second data frames are transferred sector by sector from the input logic 120 in synchronization with the system clock 160 to the multiplexers 130 where the sectors of the first and second data frames are merged at about the same speed as the system clock speed based on a merge mask.

Figure 3:
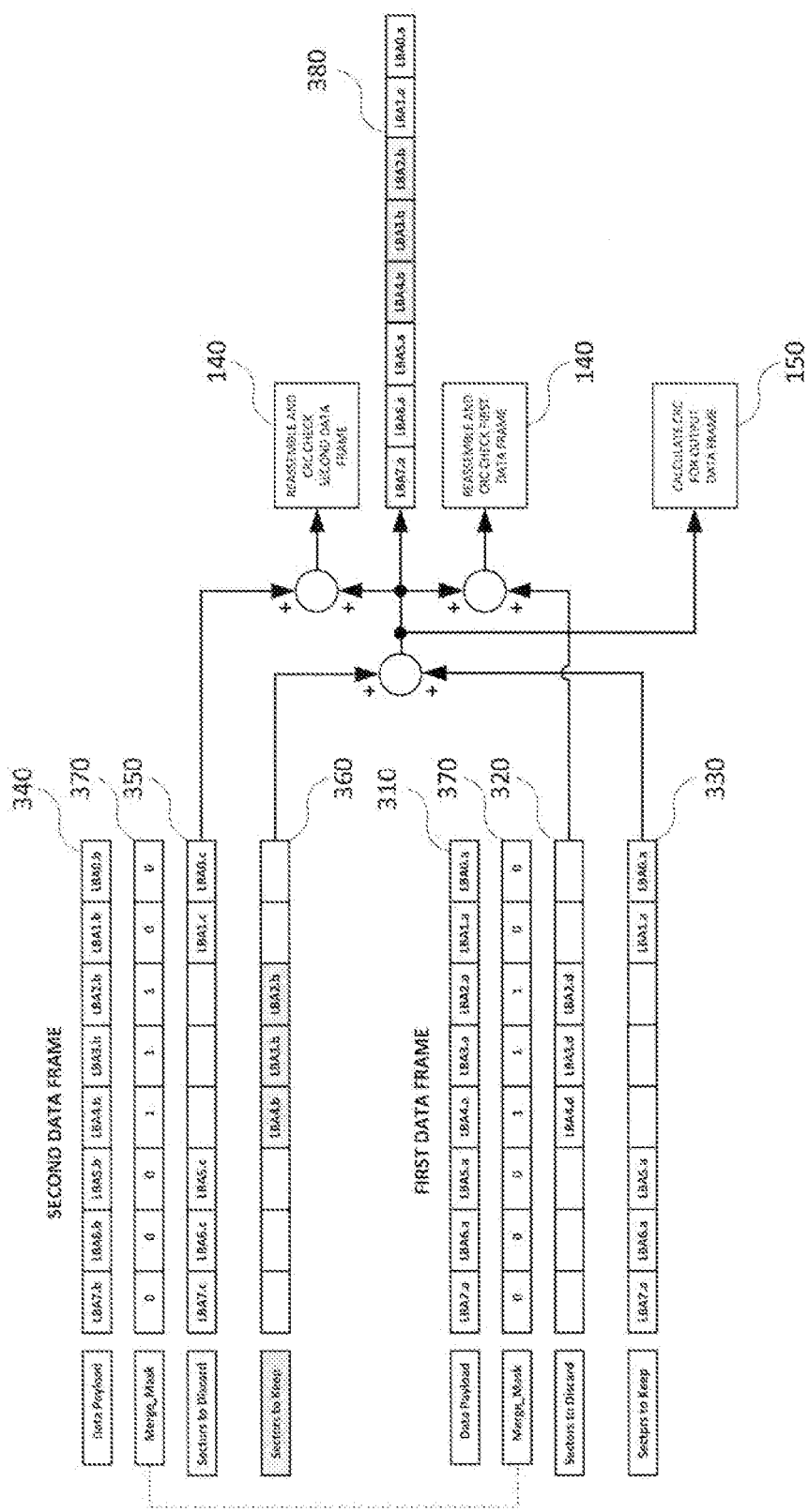
FIG. 3 is a diagram illustrating a method of merging of a first data frame and a second data frame using a merge mask according to an example embodiment of the present inventive concept.

FIG. 3 is a diagram illustrating merging of a first data frame and a second data frame using a merge mask according to an example embodiment of the present inventive concept. In the example illustration of FIG. 3, the merge mask indicates a sector to merge into the output data frame with a "1" and a sector to discard with a "0" with respect to the second data frame, and indicates a sector to merge into the output data frame with a "0" and a sector to discard with a "1" with respect to the first data frame. One of ordinary skill in the art will understand that the designations "1" and "0" are merely exemplary and that other designations are possible without departing from the scope of the inventive concept.

Referring to FIG. 3, a merge mask 370 specifies sectors of the second data frame 340 which will be merged with sectors of the first data frame 310 in place of sectors of the first data frame 310 which will be discarded (shown as sectors to discard 320). Sectors of the second data frame 340 which are not specified to merge into the output data frame by the merge mask 370 are discarded (shown as sectors to discard 350) while sectors of the second data frame 340 which are specified to merge into the output data frame by the merge mask 370 (shown as sectors to merge 360) are merged with the first data frame 310 to generate a merged output data frame 380. Conversely, sectors of the first data frame 310 which are not specified to merge into the output data frame by the merge mask 370 are discarded (shown as sectors to discard 320) while sectors of the first data frame 310 which are specified to merge into the output data frame (shown as sectors to merge 330) by the merge mask 370 are merged with the sectors to merge 360 of the second data frame 340 to generate the merged output data frame 380. In other words, sectors of the first data frame specified by the merge mask are replaced by corresponding sectors of the second data frame in order to generate the merged output data frame and the unused sectors of the first and second data frames are discarded.

While the above merge operations are described in terms of specified sectors of the second data frame which may be merged with sectors of the first data frame, one of ordinary skill in the art will appreciate that the scope of the present inventive concept also includes merging specified sectors of the first data frame with sectors of the second data frame. Also, while illustrated as such in FIG. 3, the number of sectors in the plurality of sectors of the first data frame and the second data frame may not be identical.

Referring again to FIG. 2, in one example embodiment each sector of the second data frame is transmitted to a first multiplexer 5 on a sector by sector basis in synchronization with the system clock. In one example embodiment, the first multiplexer 5 transmits each sector of the second data frame to a second multiplexer 6 and a merge multiplexer 8. Simultaneously, the first data frame is transmitted to a third multiplexer 4. In one example embodiment, the third multiplexer 4 transmits each sector of the first data frame to a fourth multiplexer 15 and the merge multiplexer 8. The merge multiplexer 8 is controlled by the merge mask to select a sector from the first or second data frame to be merged into the output data frame.

In one example embodiment, the sector from the first or second data frame selected by the merge mask for merging is output by the merge multiplexer 8 as a sector of the merged output data frame and is also transmitted from the output of the merge multiplexer 8 to the second logic device 150. The second logic device 150 calculates and accumulates a CRC for the merged output data frame. Each sector of the merged output data frame is output from the RMW system 100 by an output multiplexer 17 on a sector by sector basis. Generation of the merged output data frame is performed at about the same speed as the system clock speed.

In one example embodiment, the second multiplexer 6 and the fourth multiplexer 15 select either the sector that is merged into the output data frame or the sector that is discarded and transmit the selected or discarded sector to the first logic device 140. For example, if the merge mask causes the merge multiplexer 8 to select a sector from the first data frame, the corresponding sector from the second data frame is discarded. The merge multiplexer 8 transmits the selected sector from the first data frame to the output multiplexer 17 and the output multiplexer 17 outputs the selected sector from the first data frame as a sector of the merged output data frame and also transmits the selected sector from the first data frame to the fourth multiplexer 15. The fourth multiplexer 15 selects the selected sector from the first data frame and transmits it to the first logic device 140. Simultaneously, the discarded sector of the second data frame is transmitted from the second multiplexer 6 to the first logic device 140.

In one example embodiment, the first logic device 140 reconstructs the first and second data frames as first and second check-data frames, respectively, and the CRCs of the check-data frames are calculated and accumulated by the first logic device 140 on a sector by sector basis. The first check-data frame may include sectors that are transmitted on a first subset of data paths different from the subset of data paths that sectors of the first data frame merged into the output data frame are transmitted on, and the second check-data frame may include sectors that are transmitted on a second subset of data paths different from the subset of data paths that sectors of the second data frame merged into the output data frame are transmitted on.

After processing the last sector of the first and second data frames, the CRC of the first data frame is transmitted through the third multiplexer 4 and fourth multiplexer 15 to the first logic device 140. Simultaneously, the CRC of the second data frame is transmitted through the first multiplexer 5 and second multiplexer 6 to the first logic device 140.

In one example embodiment, the first logic device 140 performs an error check by comparing the transmitted CRC of the first data frame to the CRC calculated for the first check-data frame and compares the transmitted CRC of the second data frame to the CRC calculated for the second check-data frame. If the received data frame CRCs matches the CRCs of the check-data frames, the merged output data frame will be valid since sectors of the merged output data frame passed through the same logic as the sectors of the check-data frames and no errors were introduced. If the CRCs do not match, a message is generated indicating that the merged output data frame is invalid. The validity can be verified this way because at least some of the sectors in the check-data frame are transmitted on a subset of the plurality of data paths that also transmits sectors of the merged output data frame, so that the error check of the at least one check-data frame verifies the merged output data frame. The use of output data from the actual merged data frame as part of the calculation of the check-data frame CRC ensures that any error introduced along the path of the frame merging mechanism is detected.

Concurrently with the generation of the merged output data frame, the second logic device 150 generates a CRC for the merged output data frame on a sector by sector basis. After the final sector of the merged output data frame is outputted, the CRC for the merged output data frame generated by the second logic device 150 is selected and output by the output multiplexer 17.

Figure 4:
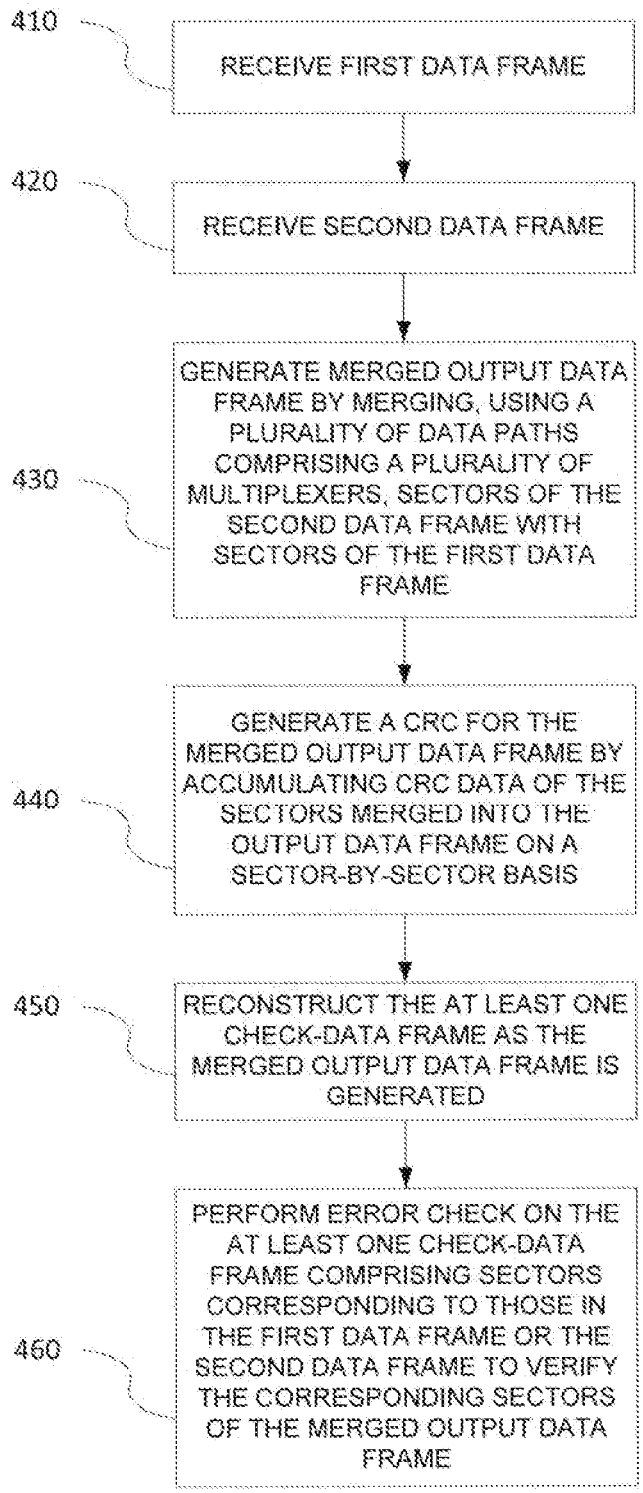
FIG. 4 is a flowchart illustrating a method of generating a merged output data frame according to an example embodiment of the present inventive concept.

FIG. 4 is a flowchart illustrating a method of generating a merged output data frame according to an example embodiment of the present inventive concept. Referring to FIG. 4, a first data frame comprising a plurality of sectors is received by the RMW system (410). The first data frame may be stored in a data storage such as in volatile or non-volatile memory. A second data frame comprising a plurality of sectors is received by the RMW system (420). The second data frame may include, for example, new data from a host system to be written to the data storage. Sectors of the first and second data frames are merged via a plurality of data paths and multiplexers to generate a merged output data frame (430). In addition, a CRC for the merged output data frame is generated by calculating and accumulating on a sector by sector basis CRC data of the first and second data frame sectors merged to generate the merged output data frame (440).

The sectors of least one of the first and second data frames are reconstructed into a check-data frame as the merged output frame is being generated (450). Alternatively, both of the first and second data frames may be reconstructed into check-data frames as the merged output frame as being generated. A CRC is calculated and accumulated on a sector by sector basis for the check-data frame, and an error check is performed on the at least one check-data frame comprising sectors corresponding to those of the first data frame or the second data frame to verify the corresponding sectors of the merged output data frame (460). Since at least some of the sectors in the check-data frame are transmitted on a subset of the plurality of data paths that transmits sectors of the merged output data frame, the error check of the at least one check-data frame verifies the sectors from the at least one check-data frame in the merged output data frame. In one example embodiment, the error check of both check-data frames verifies the sectors of the first and second check-data frames in the merged output data frame.

Figure 5:
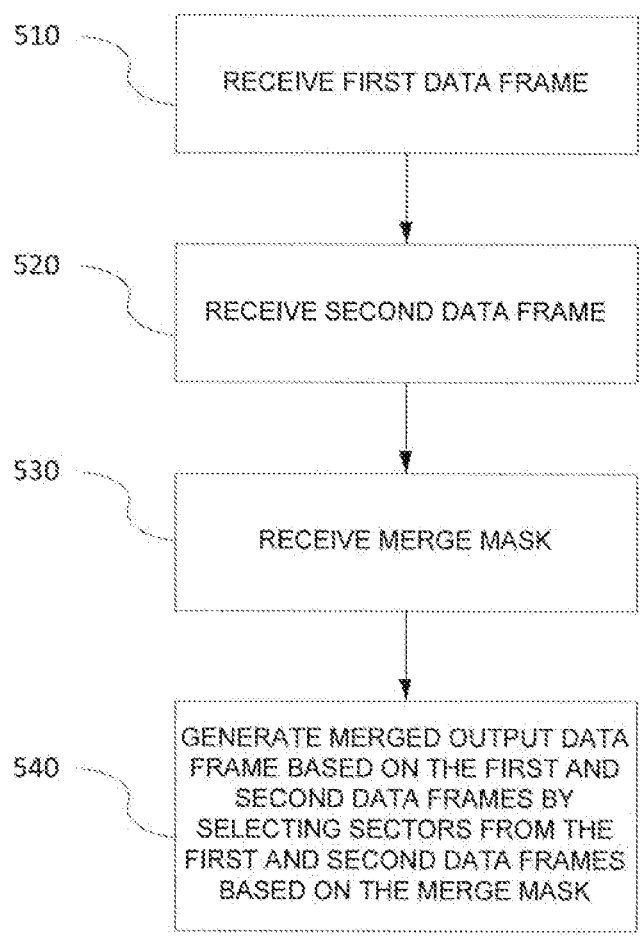
FIG. 5 is a flowchart illustrating a method of generating a merged output data frame based on a merge mask according to an example embodiment of the present inventive concept.

FIG. 5 is a flowchart illustrating a method of generating a merged output data frame based on a merge mask according to an example embodiment of the present inventive concept. Referring to FIG. 5, a first data frame comprising a plurality of sectors is received by the RMW system (510). The first data frame may be stored in a data storage such as in volatile or non-volatile memory. A second data frame comprising a plurality of sectors is received by the RMW system (520).

A merge mask which specifies sectors of the first and second data frames to be merged is received (530). The merge mask specifies which sectors of the first and second data frames occupy each sector of the output data frame. The merge mask may be received as part of the first received data frame or as part of the second received data frame. Alternatively, the merge mask may be received independently of the received data frames. A merged output data frame is generated by merging selected sectors from the first and second data frames based on the merge mask (540).

Figure 6:
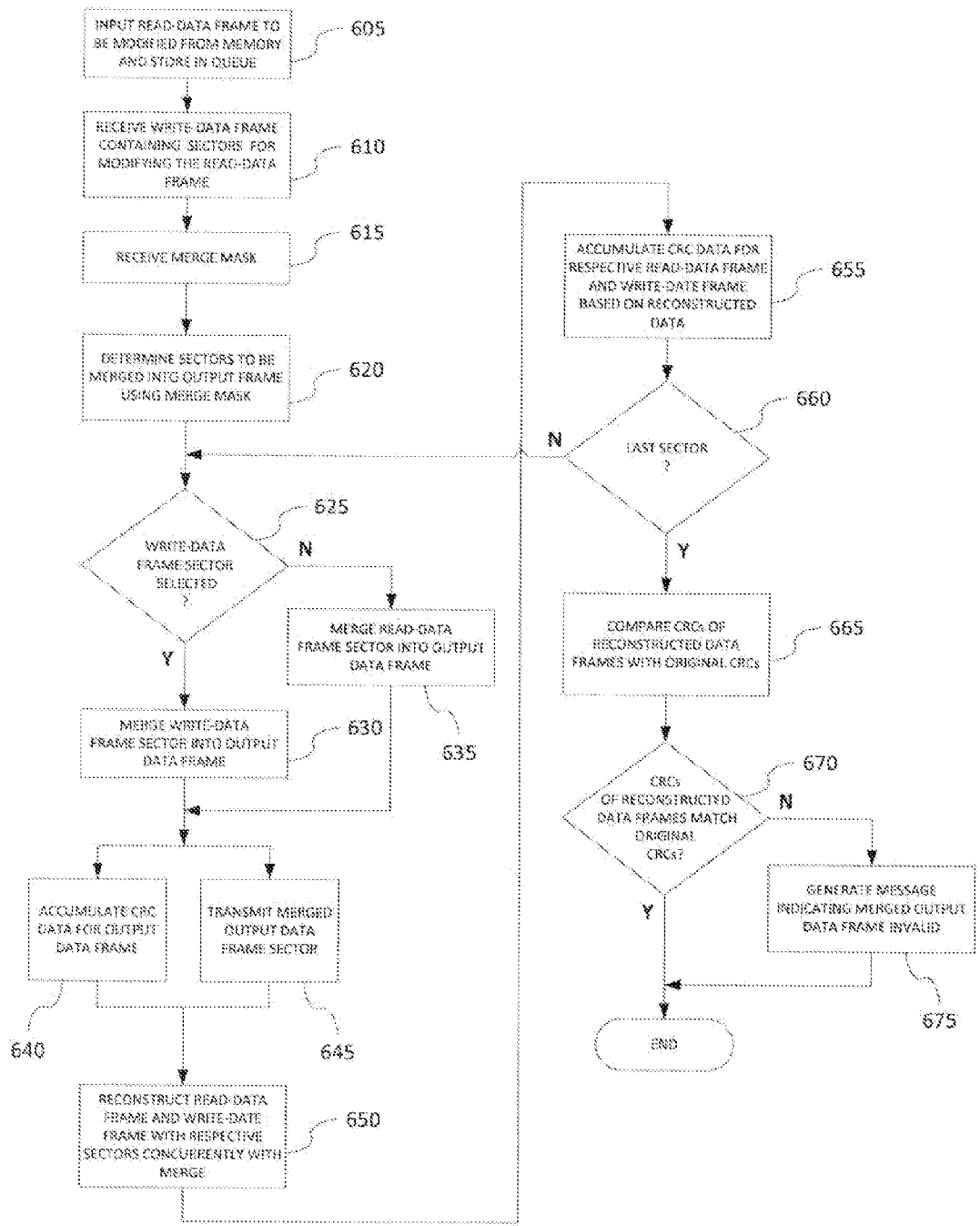
FIG. 6 is a flow chart illustrating read-modify-write operations according to an example embodiment of the present inventive concept.

FIG. 6 is a flow chart illustrating read-modify-write operations according to an example embodiment of the present inventive concept. Referring to FIG. 6, a read-data frame to be modified is input from memory external to the RMW system and stored in an internal storage (605) until a write-data frame containing sectors for modifying the read-data frame is received (610). Each of the read-data frame and the write-data frame has a plurality of sectors. The number of sectors in the plurality of sectors of the read-data frame and the write-data frame may not be identical.

A merge mask is received (615) and the sectors of the read-data frame and the write-data frame to be merged in an output data frame are determined based on the merge mask (620). If a sector of the write-data frame is selected (625-Y), the selected write-data frame sector is merged into the output data frame (630). Alternatively, if the write-data frame sector is not selected (625-N), a corresponding read-data frame sector is merged into the output data frame (635). CRC data is calculated and accumulated for the selected sector (640) and concurrently the selected sector merged into the output data frame is outputted from the RMW system (645). The unselected data frame sector is discarded.

Concurrently with the merge process, the read-data frame and the write-data frame are reconstructed with their respective sectors (650) and CRC data is calculated and accumulated for each sector of the reconstructed read-data frame and the write-data frame (655). If the reconstructed sector is not the last sector to be processed (660-N), the process at operations 625 through 655 is repeated. If the reconstructed sector is the last sector to be processed (660-Y), the CRCs of the reconstructed read-data frame and the write-data frame are compared to the CRCs of the originally received read-data frame and the write-data frame to verify that no errors were introduced into the data during the read-modify-write process (665).

If either of the CRCs for the reconstructed data frames does not match the CRCs of the originally received data frames (670-N), a message is generated indicating that the merged output data frame is invalid (675). Since at least some of the sectors in the reconstructed data frames are transmitted on a subset of the plurality of data paths that transmits sectors of the merged output data frame, the error check of the reconstructed frames verify the merged output data frame. Otherwise, if CRCs for the reconstructed data frames match the CRCs of the originally received data frames (670-Y), the merged data frame is verified to be correct.

Figure 7:
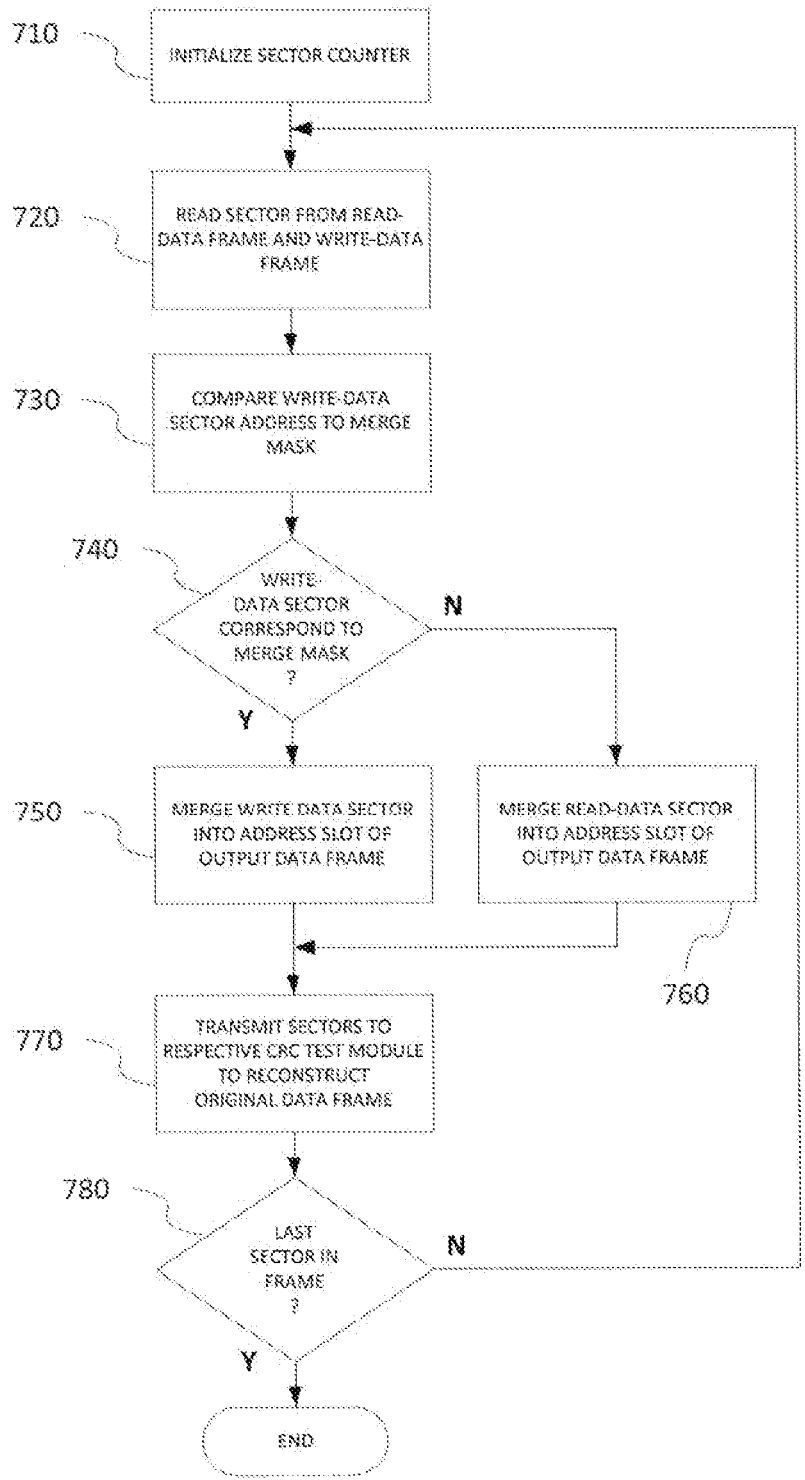
FIG. 7 is a flowchart illustrating merge operations according to an example embodiment of the present inventive concept.

Finally, FIG. 7 is a flowchart illustrating merge operations according to an example embodiment of the present inventive concept. Referring to FIGS. 3 and 7, after initializing a sector counter (710), a sector of the read-data frame and a corresponding sector of a write-data frame are read (720). The write-data sector address is compared to a merge mask (730), and if the write-data sector corresponds to the merge mask (740-Y) the write-data sector is merged into the address slot of the output data frame (750). Alternatively, if the write-data sector does not correspond to the merge mask (740-N) the read-data sector is merged into the address slot of the output data frame (760). The sectors of the read-data frame and the write-data frame are transmitted to respective CRC test modules to reconstruct the original read-data frame and the original write-data frame (770). If the reconstructed sector is not the last sector to be processed (780-N), the process at operations 720 through 770 is repeated.

While the examples explained with reference to FIG. 6 and FIG. 7 are described in terms of a read-data frame and a write-data frame, one of ordinary skill in the art will appreciate that the present inventive concept may be generalized to a first data frame and a second data frame, either of which may correspond to a read-data frame and a write-data frame.

Further, operations of the present inventive concept may be performed in the order described, in a different order, or operations may be combined. One of ordinary skill in the art will appreciate that the foregoing process is exemplary and that other variations are possible without departing from the inventive concept.

While certain embodiments have been described, these embodiments have been presented by way of example only, and are not intended to limit the scope of the protection. The methods and systems described herein may be embodied in a variety of other forms. Various omissions, substitutions, and/or changes in the form of the example methods and systems described herein may be made without departing from the spirit of the protection.

The accompanying claims and their equivalents are intended to cover such forms or modifications as would fall within the scope and spirit of the protection. For example, the example systems and methods disclosed herein can be applied to solid-state drives, hard disk drives, hybrid hard drives, and the like. In addition, other forms of storage, for example, but not limited to, DRAM or SRAM, battery backed-up volatile DRAM or SRAM devices, EPROM, EEPROM memory, etc., may additionally or alternatively be used. As another example, the various components illustrated in the figures may be implemented as software and/or firmware on a processor, ASIC/FPGA, or dedicated hardware. Also, the features and attributes of the specific example embodiments disclosed above may be combined in different ways to form additional embodiments, all of which fall within the scope of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method of merging data frames, the method comprising:
   receiving a first data frame comprising a plurality of sectors;
   receiving a second data frame comprising a plurality of sectors;
   generating a merged output data frame by merging, using a plurality of data paths comprising a plurality of multiplexers, sectors of the second data frame with sectors of the first data frame; and
   performing an error check on at least one check-data frame that comprises sectors corresponding to those in the first data frame or the second data frame,
   wherein at least some of the sectors in the check-data frame are transmitted on a subset of the plurality of data paths that transmits sectors of the merged output data frame, and
   wherein the error check verifies the merged output data frame.

2. The method of claim 1, wherein performing the error check further comprises:
   performing an error check on two check-data frames including:
   a first check-data frame including sectors corresponding to those in the first data frame; and
   a second check-data frame including sectors corresponding to those in the second data frame.

3. The method of claim 2, wherein the first check-data frame and the second check-data frame are reconstructed with their respective sectors that correspond to the first and second data frames after the sectors are transmitted through selected ones of the plurality of multiplexers based on a merge mask that indicates which sectors of the first and second data frames are to be merged into the output data frame.

4. The method of claim 2, wherein performing the error check further comprises:
   comparing cyclic redundancy codes (CRCs) of the first data frame and second data frame with CRCs generated for the first and second check-data frames, respectively, and
   if either CRC comparison does not match, generating a message indicating the merged output data frame is invalid.

5. The method of claim 4, wherein the CRC of the first check-data frame is generated by accumulating CRC data of the first check-data frame on a sector-by-sector basis and the CRC of the second check-data frame is generated by accumulating CRC data of the second check-data frame on a sector-by-sector basis.

6. The method of claim 2, wherein each sector in the merged output data frame is in either the first check-data frame or the second check-data frame.

7. The method of claim 2, wherein:
   the first check-data frame further comprises sectors that are transmitted on a first subset of data paths different from the subset of data paths that sectors of the first data frame merged into the output data frame are transmitted on, and
   the second check-data frame further comprises sectors that are transmitted on a second subset of data paths different from the subset of data paths that sectors of the second data frame merged into the output data frame are transmitted on.

8. The method of claim 1, wherein the at least one check-data frame further comprises sectors that are transmitted on a subset of data paths different from the subset of data paths that sectors of the merged output data frame are transmitted on.

9. The method of claim 1, wherein the sectors of at least one of the first and second data frames to be merged into the output data frame are specified by a merge mask.

10. The method of claim 9, wherein the merge mask specifies which sectors of the first and second data frames occupy each sector of the output data frame.

11. The method of claim 1, further comprising reconstructing the at least one check-data frame as the merged output data frame is generated.

12. The method of claim 1, further comprising generating a cyclic redundancy code (CRC) for the merged output data frame by accumulating CRC data of the sectors merged into the output data frame on a sector-by-sector basis.

13. An apparatus for merging data frames, the apparatus comprising:
   one or more devices configured to receive a first data frame comprising a plurality of sectors and a second data frame comprising a plurality of sectors; and
   circuitry comprising a plurality of data paths comprising a plurality of multiplexers, the circuitry configured to:
   generate, using the plurality of data paths, a merged output data frame by merging sectors of the second data frame with sectors of the first data frame; and
   perform an error check on at least one check-data frame that comprises sectors corresponding to those in the first data frame or the second data frame,
   wherein at least some of the sectors in the check-data frame are transmitted on a subset of the plurality of data paths that transmits sectors of the merged output data frame,
   wherein the error check verifies the merged output data frame.

14. The apparatus of claim 13, wherein the one or more devices further comprises:
   a storage configured to store the first data frame; and
   a data port configured to receive the second data frame.

15. The apparatus of claim, 13 wherein the circuitry is further configured to perform the error check by at least:
   performing an error check on two check-data frames including:

a first check-data frame including sectors corresponding to those in the first data frame; and a second check-data frame including sectors corresponding to those in the second data frame.

16. The apparatus of claim 15, wherein the first check-data frame and the second check-data frame are reconstructed with their respective sectors that correspond to the first and second data frames by at least one first logic device after the sectors are transmitted through selected ones of the plurality of multiplexers based on a merge mask that indicates which sectors of the first and second data frames are to be merged into the output data frame.

17. The apparatus of claim 16, wherein the at least one first logic device is configured to:

compare a cyclic redundancy code (CRC) of the first data frame with a CRC generated for the first check-data frame;

compare a CRC of the second data frame with a CRC generated for the second check-data frame; and if either CRC comparison does not match, generate a message indicating the merged output data frame is invalid.

18. The apparatus of claim 17, wherein the at least one first logic device is further configured to:

generate the CRC of the first check-data frame by accumulating CRC data of the first check-data frame on a sector-by-sector basis; and generate the CRC of the second check-data frame by accumulating CRC data of the second check-data frame on a sector-by-sector basis.

19. The apparatus of claim 15, wherein each sector in the merged output data frame is in either the first check-data frame or the second check-data frame.

20. The apparatus of claim 15, wherein:

the first check-data frame further comprises sectors that are transmitted on a first subset of data paths different from the subset of data paths that sectors of the first data frame merged into the output data frame are transmitted on, and the second check-data frame further comprises sectors that are transmitted on a second subset of data paths different from the subset of data paths that sectors of the second data frame merged into the output data frame are transmitted on.

21. The apparatus of claim 13, wherein the at least one check-data frame further comprises sectors that are transmitted on from a subset of data paths different from the subset of data paths that sectors of the merged output data frame are transmitted on.

22. The apparatus of claim 13, wherein the sectors of the at least one of the first and second data frames to be merged into the output data frame are specified by a merge mask.

23. The apparatus of claim 22, wherein the merge mask specifies which sectors of the first and second data frames occupy each sector of the output data frame.

24. The apparatus of claim 22, wherein the merge mask is incorporated into one of the first and the second data frames.

25. The apparatus of claim 22, wherein the merge mask is received separately from the first and second data frames.

26. The apparatus of claim 13, further comprising at least one first logic device configured to reconstruct the at least one check-data frame as the merged output data frame is generated.

27. The apparatus of claim 13, further comprising a second logic device configured to generate a cyclic redundancy code (CRC) for the merged output data frame by accumulating CRC data of the sectors merged into the output data frame on a sector-by-sector basis.

28. The apparatus of claim 13, wherein the circuitry further comprises a processor, and wherein generating the merged output data frame and performing the error check are performed under the control of the processor.

29. A method of merging data frames, the method comprising:

receiving a first data frame comprising a plurality of sectors;

receiving a second data frame comprising a plurality of sectors; and generating a merged output data frame based on the first data frame and the second data frame, the generating comprising, for each address slot in the merged output data frame, selecting a sector from either the first data frame or the second data frame based on a merge mask.

30. The method of claim 29, wherein the merge mask is incorporated into the one of the first and second data frames.

31. The method of claim 29, wherein the merge mask is received separately from the first and second data frames.

32. An apparatus for merging data frames, the apparatus comprising:

a first circuit configured to receive a first data frame comprising a plurality of sectors;

a second circuit configured to receive a second data frame comprising a plurality of sectors; and a plurality of data paths configured to generate a merged output data frame based on the first data frame and the second data frame, wherein the generating comprises, for each address slot in the merged output data frame, selecting a sector from either the first data frame or the second data frame based on a merge mask.

33. The apparatus of claim 32, wherein the first circuit comprises a storage configured to store the first data frame; and the second circuit comprises a data port configured to receive the second data frame.

34. The apparatus of claim 32, wherein the merge mask is incorporated into the one of the first and second data frames.

35. The apparatus of claim 32, wherein the merge mask is received separately from the first and second data frames.

* * * * *